(12) United States Patent
King et al.

(10) Patent No.: US 7,217,048 B2
(45) Date of Patent: May 15, 2007

(54) PAGEWIDTH PRINTER AND COMPUTER KEYBOARD COMBINATION

(75) Inventors: Tobin Allen King, Balmain (AU); Kia Silverbrook, Balmain (AU)

(73) Assignee: Silverbrook Research Pty Ltd, Balmain, NSW (AU)

( * ) Notice: Subject to any disclaimer, the term of this patent is extended or adjusted under 35 U.S.C. 154(b) by 55 days.

(21) Appl. No.: 11/149,159

(22) Filed: Jun. 10, 2005

(65) Prior Publication Data

US 2005/0226667 A1   Oct. 13, 2005

Related U.S. Application Data

(63) Continuation of application No. 10/487,820, filed as application No. PCT/AU02/01052 on Aug. 6, 2002, now Pat. No. 6,986,613, which is a continuation of application No. 09/966,293, filed on Sep. 28, 2001, now Pat. No. 6,641,315, which is a continuation of application No. 09/112,767, filed on Jul. 10, 1998, now Pat. No. 6,416,167.

(30) Foreign Application Priority Data

Jul. 15, 1997 (AU) .................................. PO7991
Mar. 25, 1998 (AU) .................................. PO2592

(51) Int. Cl.
 *B41J 5/16* (2006.01)
(52) U.S. Cl. ........................................ 400/472; 400/88
(58) Field of Classification Search ........ 400/472–489, 400/88; 345/168–170; 361/680; 341/22
See application file for complete search history.

(56) References Cited

U.S. PATENT DOCUMENTS

| 4,423,401 A | 12/1983 | Mueller |
| 4,553,393 A | 11/1985 | Ruoff |
| 4,672,398 A | 6/1987 | Kuwabara et al. |
| 4,737,802 A | 4/1988 | Mielke |
| 4,855,567 A | 8/1989 | Mueller |
| 4,864,824 A | 9/1989 | Gabriel et al. |
| 5,029,805 A | 7/1991 | Albarda et al. |
| 5,188,464 A | 2/1993 | Aaron |
| 5,258,774 A | 11/1993 | Rogers |
| 5,443,320 A | 8/1995 | Agata et al. |

(Continued)

FOREIGN PATENT DOCUMENTS

DE   1648322 A   3/1971

(Continued)

OTHER PUBLICATIONS

Noworolski, J. Mark et al, "Process for in-plane and out-of-plane-single crystal-silicon thermal microactuators". Sensors and Actuators, A, CH, Elsevier Sequoia S.A., Lausanne, vol. 55, No. 1, Jul. 15, 1996, pp. 65-69, XP004077979 ISSN: 0924-4247.

(Continued)

*Primary Examiner*—Anthony H. Nguyen

(57) ABSTRACT

A keyboard 10 includes a housing 12. An alphanumeric keypad 14 is carried by the housing 12. A printer 16 is arranged in the housing 12. The printer includes a print media feed mechanism having a spiked wheel for engaging the print media and transporting the print media through the keyboard housing.

8 Claims, 3 Drawing Sheets

U.S. PATENT DOCUMENTS

| | | | |
|---|---|---|---|
| 5,477,238 A * | 12/1995 | Aharanson et al. | 345/168 |
| 5,493,409 A | 2/1996 | Maeda et al. | |
| 5,552,812 A * | 9/1996 | Ebinuma et al. | 347/34 |
| 5,605,659 A * | 2/1997 | Moynihan et al. | 264/430 |
| 5,638,104 A * | 6/1997 | Suzuki et al. | 347/171 |
| 5,659,345 A | 8/1997 | Altendorf | |
| 5,666,141 A | 9/1997 | Matoba et al. | |
| 5,719,604 A | 2/1998 | Inui et al. | |
| 5,738,454 A * | 4/1998 | Zepeda et al. | 400/625 |
| 5,812,159 A | 9/1998 | Anagnostopoulos et al. | |
| 5,845,144 A | 12/1998 | Tateyama et al. | |
| 5,896,155 A | 4/1999 | Lebens et al. | |
| 6,007,187 A | 12/1999 | Kashino et al. | |
| 6,041,106 A | 3/2000 | Parsadayan et al. | |
| 6,155,669 A | 12/2000 | Donahue et al. | |
| 6,158,906 A | 12/2000 | Simon et al. | |
| 6,464,415 B1 | 10/2002 | Vaghi | |

FOREIGN PATENT DOCUMENTS

| | | |
|---|---|---|
| DE | 2905063 | 8/1980 |
| DE | 3245283 A | 6/1984 |
| DE | 3430155 A | 2/1986 |
| DE | 3716996 A | 12/1988 |
| DE | 3934280 A | 4/1990 |
| DE | 4328433 A | 3/1995 |
| DE | 19516997 A | 11/1995 |
| DE | 19517969 A | 11/1995 |
| DE | 19532913 A | 3/1996 |
| DE | 19623620 A1 | 12/1996 |
| DE | 19639717 A | 4/1997 |
| EP | 0092229 A | 10/1983 |
| EP | 0398031 A | 11/1990 |
| EP | 0427291 A | 5/1991 |
| EP | 0431338 A | 6/1991 |
| EP | 0478956 | 4/1992 |
| EP | 0506232 A | 9/1992 |
| EP | 0510648 A | 10/1992 |
| EP | 0627314 A | 12/1994 |
| EP | 0634273 A2 | 1/1995 |
| EP | 0706893 B1 | 4/1996 |
| EP | 0713774 A2 | 5/1996 |
| EP | 0737580 A | 10/1996 |
| EP | 0750993 A | 1/1997 |
| EP | 0882590 A | 12/1998 |
| FR | 2231076 | 12/1974 |
| GB | 792145 A | 3/1958 |
| GB | 1428239 A | 3/1976 |
| GB | 2262152 A | 6/1993 |
| JP | 58112747 A | 7/1983 |
| JP | 58116165 A | 7/1983 |
| JP | 61025849 A | 2/1986 |
| JP | 61268453 A | 11/1986 |
| JP | 01105746 A | 4/1989 |
| JP | 01115639 A | 5/1989 |
| JP | 01128839 A | 5/1989 |
| JP | 01257058 A | 10/1989 |
| JP | 01306254 A | 12/1989 |
| JP | 02050841 A | 2/1990 |
| JP | 292643 A | 4/1990 |
| JP | 2108544 A | 4/1990 |
| JP | 02158348 A | 6/1990 |
| JP | 02162049 A | 6/1990 |
| JP | 2265752 A | 10/1990 |
| JP | 03653348 | 3/1991 |
| JP | 03112662 A | 5/1991 |
| JP | 03180350 A | 8/1991 |
| JP | 04118241 A | 4/1992 |
| JP | 04126255 A | 4/1992 |
| JP | 04141429 A | 5/1992 |
| JP | 404001051 A | 6/1992 |
| JP | 4353458 A | 12/1992 |
| JP | 04368851 A | 12/1992 |
| JP | 051108278 | 4/1993 |
| JP | 05284765 A | 10/1993 |
| JP | 05318724 A | 12/1993 |
| JP | 691865 A | 4/1994 |
| JP | 691866 A | 4/1994 |
| JP | 07314665 A | 12/1995 |
| JP | 09113990 A | 5/1997 |
| WO | WO 94/18010 A | 8/1994 |
| WO | WO 95/10810 | 4/1995 |
| WO | WO 97/04353 A | 2/1997 |
| WO | WO 97/12689 A | 4/1997 |
| WO | WO 97/50243 A | 12/1997 |
| WO | WO 2000/26379 A | 5/2000 |

OTHER PUBLICATIONS

Ataka, Manabu et al, "Fabrication and Operation of Polymide Bimorph Actuators for Ciliary Motion System". Journal of Microelectromechanical Systems, US, IEEE Inc. New York, vol. 2, No. 4, Dec. 1, 1993, pp. 146-150, XP000443412, ISSN: 1057-7157.

Yamagata, Yutaka et al, "A Micro Mobile Mechanism Using Thermal Expansion and its Theoretical Analysis". Proceeding of the workshop on micro electro mechanical systems (MEMS), US, New York, IEEE, vol. Workshop 7, Jan. 25, 1994, pp. 142-147, XP000528408, ISBN: 0-7803-1834-X.

"ABLEDATA Database of Assistive Technology", Feb. 1999 p. 2-3 shows Postron Express keyboard/print.

"Enhanced Communications" website showing Postron Express keyboard/printer. Copyright 1997-2000 http://web.archive.org/web/20020819213551re_/http://www.enhancedcom.net/posistron express.asp.

"TDD Products for PSAPS" (Larson) Mar./Apr. 1997 from 9-11 Magazine Note: Establishes that "Positron Express" keyboard integrated with printer was known in 1997.

* cited by examiner

PAGEWIDTH PRINTER AND COMPUTER KEYBOARD COMBINATION

CROSS REFERENCE TO RELATED APPLICATION

The present application is a continuation of U.S. application Ser. No. 10/487,820 filed Feb. 27, 2004, now U.S. Pat. No. 6,986,613 which is a 371 of PCT/AU02/01052 filed Aug. 6, 2002, which is a continuation of Ser. No. 09/966,293 filed Sep. 28, 2001, now issued U.S. Pat. No. 6,641,315, which is a continuation of Ser. No. 09/112,767 filed on Jul. 10, 1998, now issued U.S. Pat. No. 6,416,167, the entire contents of which are herein incorporated by reference.

FIELD OF INVENTION

This invention relates to a keyboard. More particularly, the invention relates to a computer keyboard.

BACKGROUND TO THE INVENTION

Printers for use with computers can be relatively expensive devices. Accordingly, in a work environment, it is common for a plurality of work stations to be serviced by a single printer station with the computers of those work stations communicating with the printer.

This necessitates people at the work station having to get up and collect their documents from the printer which can be time wasting. Often, all that is required is a single sheet of paper, for example, where a letter is to be generated or where an image is to be viewed and a hard copy of the image is required.

Desktop inkjet printers are available at low cost, but typically take up substantial desk space. Incorporation of the printing function in a desktop computer keyboard frees up this desk space.

While it is technically possible to incorporate a scanning ink jet printer into a keyboard, this has several disadvantages, including excess bulk, and side-to-side vibration as the printhead scans.

Recently, the present inventor has invented ink jet printer technologies suitable for incorporation in a desktop keyboard, such as:

| | | | | |
|---|---|---|---|---|
| 6,227,652 | 6,213,588 | 6,213,589 | 6,231,163 | 6,247,795 |
| 6,394,581 | 6,244,691 | 6,257,704 | 6,416,168 | 6,220,694 |
| 6,257,705 | 6,247,794 | 6,234,610 | 6,247,793 | 6,264,306 |
| 6,241,342 | 6,247,792 | 6,264,307 | 6,254,220 | 6,234,611 |
| 6,302,528 | 6,283,582 | 6,239,821 | 6,338,547 | 6,247,796 |
| 6,557,977 | 6,390,603 | 6,362,843 | 6,293,653 | 6,312,107 |
| 6,227,653 | 6,234,609 | 6,238,040 | 6,188,415 | 6,227,654 |
| 6,209,989 | 6,247,791 | 6,336,710 | 6,217,153 | 6,416,167 |
| 6,243,113 | 6,283,581 | 6,247,790 | 6,260,953 | 6,267,469 |
| 6,273,544 | 6,309,048 | 6,420,196 | 6,443,558 | 6,439,689 |
| 6,378,989 | 6,848,181 | 6,634,735 | 6,623,101 | 6,406,129 |
| 6,505,916 | 6,457,809 | 6,550,895 | 6,457,812 | 6,428,133 |

These ink jet technologies are suitable for the construction of miniature, low cost pagewidth printers, which can readily fit within a keyboard form factor.

SUMMARY OF THE INVENTION

According to a first aspect of the invention, there is provided a keyboard, particularly for use with a computer, the keyboard including a housing;
an alphanumeric keypad carried by the housing; and
a page width printer arranged in the housing.

The housing has dimensions approximating those of a standard computer keyboard, the housing having an ejection slot along one, longer side through which print media can be ejected after an image has been printed on the print media by the printer.

Preferably, the housing includes an input slot along an opposed, longer side for feeding print media to the printer. Typically, the print media is in the form of sheets of paper to be fed to the printer one sheet at a time.

The keyboard may include a feed means arranged in the housing for feeding the print media from the input slot to the printer. The feed means may be arranged within the housing and may be in the form of a belt drive arrangement for feeding the print media to the printer.

Further, the keyboard may include an engaging means arranged intermediate the printer and the ejection slot for feeding the print media out of the ejection slot. Thus, the engaging means may be arranged downstream of the printer and may be in the form of one or more spiked wheels which grip and transport the print media to the ejection slot.

As indicated above, the keyboard is particularly intended for use with a computer. Accordingly, the keypad may include a standard, QWERTY keypad, a numerals keypad and a plurality of control keys.

the housing may include an access opening for enabling an ink supply of the printer to be replenished. The access opening may be closed off by a lid in a top surface of the housing. The ink supply of the printer may include a removable ink cartridge which is accessed through the access opening of the housing.

Preferably, the printer is a full color printer. The printer may be a photo quality printer.

The printhead may comprise an array of nozzles, said array being fabricated by microelectromechanical (MEMS) techniques.

According to a second aspect of the invention, there is provided a computer keyboard which includes a housing having an array of keys carried thereon and defining a chamber;
a pagewidth ink jet printer arranged within the chamber of the housing; and
an input slot in one side of the housing for feeding print media to the printer and an ejection slot in an opposed side of the housing through which the print media is ejected after printing.

BRIEF DESCRIPTION OF THE DRAWINGS

The invention is now described by way of example with reference to the accompanying diagrammatic drawings in which.

DETAILED DESCRIPTION OF THE DRAWINGS

Figure 2:
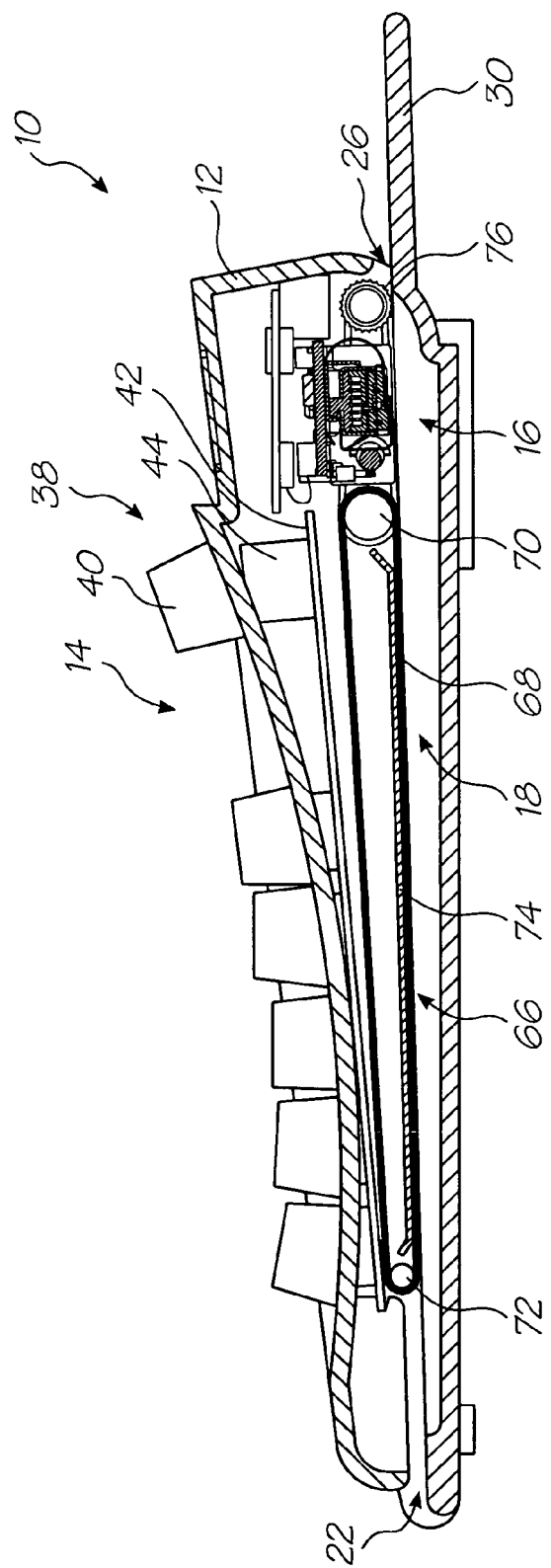
FIG. 2 shows a sectional side view of the keyboard.
Figure 3:
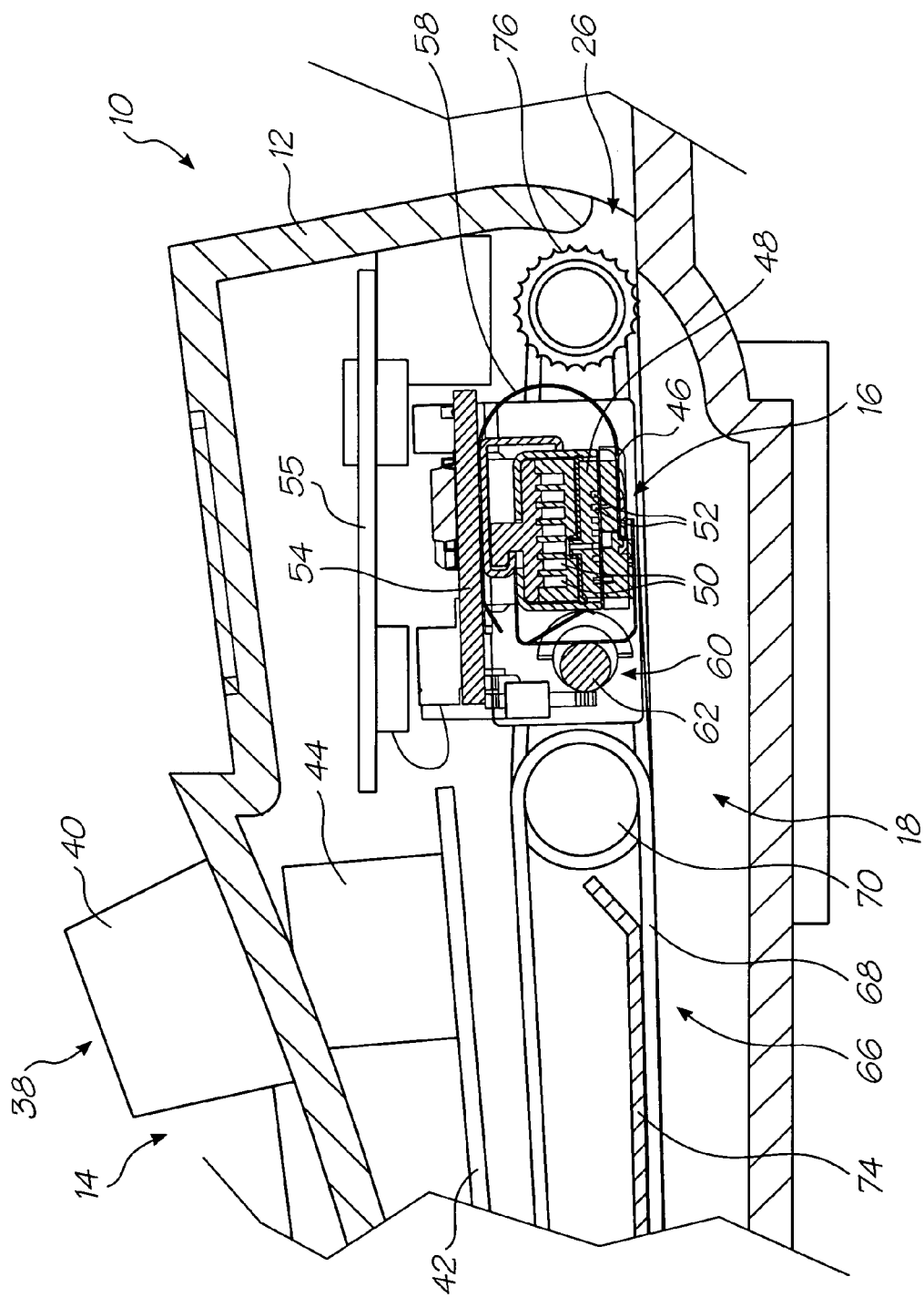
FIG. 3 shows, on an enlarged scale, a sectional side view of part of the keyboard.

In the drawings, reference numeral 10 generally designates a keyboard in accordance with the invention. The keyboard 10 is intended particularly for use with a computer. The keyboard 10 comprises a housing 12 on which a keypad 14 is arranged. A printer 16 (FIGS. 2 and 3) is contained in a chamber 18 defined in the housing 12 of the keyboard 10.

The housing 12 is dimensioned similarly to a conventional computer keyboard and is substantially rectangular when viewed in plan having a pair of opposed, longer sides and a pair of opposed, shorter sides. An input slot 22 is defined in one of the longer sides of the housing 12 for feeding print media in the form of a sheet of paper 24 to the printer 16. Preferably, the input slot 22 is defined in that side of the housing 12 which, in use, is closer to a user of the keyboard 10.

An ejection slot 26 is defined in an opposed, longer side of the housing through which the sheet of print media, incorporating an image 28, is ejected after completion of printing. An exit tray 30 extends outwardly from the ejection slot 26 on to which the sheet of paper 24 is fed after printing.

The keypad 14 includes an array if keys 38 arranged in a QWERTY keypad 32, a numerals keypad 34 and a plurality of control keys 36. Each key 38 of the keypad 14 includes a key cap 40 which communicates with a keyboard circuit board 42 (FIGS. 2 and 3) through an opening in a top surface of the housing 12. The key caps 40 engage key switches 44 mounted on the circuit board 42.

The printer 16 comprises a page width ink jet printhead 46 mounted in a support 48. The printhead 46 is a multi-color printhead for printing photo quality images 28. Accordingly, the support 48 includes a plurality of galleries 50, each of which contains a different color ink to be fed via passages 52 to the printhead 46.

Figure 1:
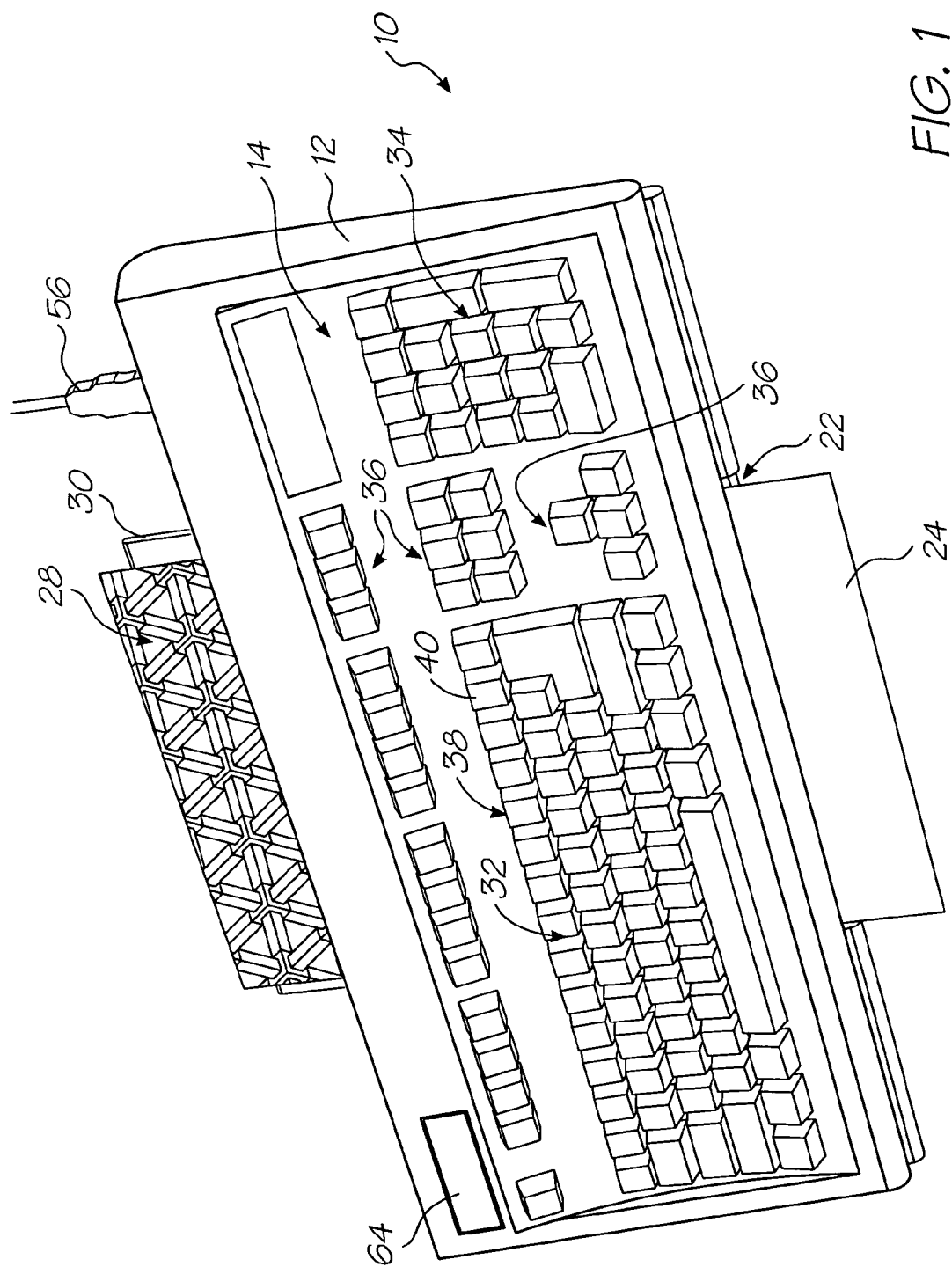
FIG. 1 shows a three dimensional view of a keyboard, in accordance with the invention.

The printer 16 includes a controller printed circuit board (PCB) 55. The PCB 55 receives printing commands from the computer (not shown) via a USB connector 56 (FIG. 1). A printhead PCB 54 communicates with the printhead 46 via a TAB automated bond film 58 or any other suitable, flexible film. The controller PCB 55 connects to the printhead PCB 54 via a flexible film.

A retaining device, in the form of a locking member 60, releasably locks the printer 16 in position in the chamber 18 of the housing 12. The locking device 60 includes a cam-like locking member 62.

Further, the printer 16 includes an ink supply cartridge (not shown) for feeding ink to the galleries 50 of the printhead support 48. The ink supply cartridge is accessed through an opening, closed off by a lid 64 (FIG. 1), in a top surface of the housing 12 to replace the cartridge when its supply of ink has been depleted.

The keyboard 10 includes a feed mechanism 66 for feeding the sheet of paper 24 to the printer 16. The feed mechanism 66 comprises an endless belt 68 which is rotated by a drive roller 70 and extends about an opposed, idler roller 72. A planar member in the form of a sprung metal plate 74 bears against the belt 68 to maintain the planarity of the belt 68 and, accordingly, the sheet of paper 24.

An engaging means, in the form of at least one spiked wheel 76, is arranged intermediate the printer 16 and the ejection slot 26. The, or each, spiked wheel 76 engages the sheet of paper 24, after printing of the image 28, and feeds the sheet of paper 24 through the ejection slot 26 to be accessed by the user.

In use, when an image 28 is to be printed, the user inserts a sheet of paper into the keyboard through the input slot 22 where it is fed to the printer 16 by the feed arrangement 66.

By means of an appropriate command via the computer, the information or image to be printed is fed to the printer 16 via the USB connector 56 and the controller PCB 55. The printer 16 is controlled by the PCB 55 to print the image 28 on the sheet of paper 24 and to cause ejection of the sheet of paper 24 together with its printed image 28 thereon through the ejection slot 26.

It is an advantage of the invention that a computer peripheral is provided which enables a person rapidly to obtain copies of images while seated before the person's computer. In this regard, it is to be noted that the printer 16 is a high speed printer which can print at rates of up to 30 pages per minute. Hence, the need for using a communal work station is obviated. In addition, the incorporation of the printer within the keyboard 10 considerably reduces the space required for a computer together with its peripherals and, in so doing, providing more space to a user. It will be appreciated that this can be of major benefit where the work station is a confined working space.

The invention claimed is:

1. A stand alone keyboard which includes
a housing separate from a computer;
an alphanumeric keypad carried byte housing, the keypad including key switches mounted on a circuit board;
a page width printer ranged in the housing; and,
an input slot in one side of the housing for receiving print sheets into the housing;
an ejection slot in an opposite side of the housing for ejecting printed sheets:
a feed mechanism positioned between the circuit board and an underside of the housing, the feed mechanism being arranged for carrying and feeding the print sheets from the input slot to the printer; and
an engaging means arranged intermediate the printer and the ejection slot for feeding the print media out of the ejection slot, said engaging means including a spiked wheel for engaging the print media.

2. The keyboard of claim 1 in which the housing has dimensions approximating those of a computer keyboard, the housing having an ejection slot through which print media can be ejected after an image has been printed on the print media by the printer.

3. The keyboard of claim 2 in which the ejection slot is in an opposed side of the housing to the input slot.

4. The keyboard of claim 1 in which the keypad includes a QWERTY keypad, a numerals keypad and a plurality of control keys.

5. The keyboard of claim 1 in which the housing includes an access opening for enabling an ink supply of the printer to be replenished.

6. The keyboard of claim 1 in which the printer is a full color printer.

7. The keyboard of claim 6 in which the printer is a photo quality color printer.

8. The keyboard of claim 1 in which the printhead comprises an array of nozzles, said array being fabricated by microelectromechanical techniques.

* * * * *

UNITED STATES PATENT AND TRADEMARK OFFICE
CERTIFICATE OF CORRECTION

PATENT NO. : 7,217,048 B2  Page 1 of 1
APPLICATION NO. : 11/149159
DATED : May 15, 2007
INVENTOR(S) : Tobin Allen King and Kia Silverbrook It is certified that error appears in the above-identified patent and that said Letters Patent is hereby corrected as shown below:

Title Page should read
(63) Continuation of application No. 10/487,820, filed as application No. PCT/AU02/01052 on Aug. 6, 2002, now Pat. No. 6,986,613, which is a continuation-in-part of application No. 09/966,293, filed on Sept. 28, 2001, now Pat. No. 6,641,315, which is a continuation-in-part of application No. 09/112,767, filed on Jul. 10, 1998, now Pat. No. 6,416,167.

Column 1, lines 7-14 should read:

The present application is a continuation of US application Ser. No. 10/487,820 filed Feb. 27, 2004, now US Pat. No. 6,986,613 which is a 371 of PCT/AU02/01052 filed Aug. 6, 2002, which is a continuation-in-part of Ser. No. 09/966,293 filed Sep. 28, 2001, now issued US Pat. No. 6,641,315, which is a continuation-in-part of Ser. No. 09/112,767 filed on Jul. 10, 1998, now issued US Pat. No. 6,416,167, the entire contents of which are herein incorporated by reference.

Column 4, Claim 1, lines 20-24 should read:

A stand alone keyboard which includes a housing separate from a computer; an alphanumeric keypad carried by the housing, the keypad including key switches mounted on a circuit board;

Signed and Sealed this

Nineteenth Day of August, 2008

JON W. DUDAS
*Director of the United States Patent and Trademark Office*